United States Patent
Ohya et al.

(10) Patent No.: US 6,847,666 B2
(45) Date of Patent: Jan. 25, 2005

(54) SELF-SUSTAINED PULSATING LASER DIODE

(75) Inventors: Masaki Ohya, Tokyo (JP); Hiroaki Fujii, Tokyo (JP); Kenji Endo, Tokyo (JP)

(73) Assignee: NEC Corporation, Tokyo (JP)

(*) Notice: Subject to any disclaimer, the term of this patent is extended or adjusted under 35 U.S.C. 154(b) by 255 days.

(21) Appl. No.: 09/819,969

(22) Filed: Mar. 28, 2001

(65) Prior Publication Data
US 2001/0043632 A1 Nov. 22, 2001

(30) Foreign Application Priority Data
Mar. 28, 2000 (JP) ......................................... 2000-089410

(51) Int. Cl.$^7$ ................................................. H01S 5/00
(52) U.S. Cl. ........................ 372/43; 372/44; 372/45; 372/46; 372/50
(58) Field of Search ............................. 372/43, 44, 45, 372/46, 50, 47

(56) References Cited

U.S. PATENT DOCUMENTS

| | | | | |
|---|---|---|---|---|
| 4,961,197 A | * | 10/1990 | Tanaka et al. | 372/45 |
| 5,586,136 A | * | 12/1996 | Honda et al. | 372/45 |
| 6,031,858 A | * | 2/2000 | Hatakoshi et al. | 372/46 |
| 6,265,732 B1 | * | 7/2001 | Nakatsu et al. | 257/86 |
| 6,487,226 B1 | * | 11/2002 | Iwamoto et al. | 372/46 |

FOREIGN PATENT DOCUMENTS

| | | |
|---|---|---|
| JP | 6-232512 | 8/1994 |
| JP | 10-144992 | 5/1998 |
| JP | 11-87831 | 3/1999 |
| JP | 11-220210 | 8/1999 |
| JP | 11-354895 | 12/1999 |

* cited by examiner

*Primary Examiner*—Don Wong
*Assistant Examiner*—Armando Rodriguez
(74) *Attorney, Agent, or Firm*—Scully, Scott, Murphy & Presser

(57) ABSTRACT

A self-sustained pulsating laser diode in which a region in an active layer functions as a saturable absorber has at least five and no more than ten quantum wells, p-type cladding layer flat part with a layer thickness of at least 300 nm and no greater than 500 nm, and a p-type cladding layer flat part with a carrier density of at least $1 \times 10^{17}$ cm$^{-3}$ and no greater than $5 \times 10^{17}$ cm$^{-3}$. This laser diode achieves a sufficiently small current distribution compared with the light distribution in the lateral direction, thereby enabling stable self-sustained pulsating operation up to a high temperature, which was difficult to achieve in the past.

10 Claims, 3 Drawing Sheets

STRUCTURE OF AN EMBODIMENT OF THE PRESENT INVENTION

STRUCTURE OF AN EMBODIMENT OF THE PRESENT INVENTION

PRIOR ART CONSTRUCTION

SELF-SUSTAINED PULSATING LASER DIODE

BACKGROUND OF THE INVENTION

1. Field of the Invention

The present invention relates to a self-sustained pulsating laser diode, and more particularly to a red AlGaInP semiconductor laser used as an optical disk light source in a Digital Versatile Disc (DVD) or the like, and a self-sustained pulsating laser diode in which it is difficult for noise to be induced from light returning from the disc.

2. Related Art

Various low-noise self-sustained pulsating laser diodes with immunity to noise induced by returning light from an optical disc have been reported, such as in the Japanese unexamined patent publication (KOKAI) No. 10-144992 or the Japanese unexamined patent publication (KOKAI) No. 11-220210.

In FIG. 3, one basic technical conception of a self-sustained pulsating laser diode commonly shown in the above-mentioned publication is shown as an example.

In this type of self-sustained pulsating laser diode, a region in the active layer where current is not injected and light is guided functions as a saturable absorber, so that self-sustained pulsating operation occurs.

In a self-sustained pulsating laser diode of the past, as mentioned above and as shown in FIG. 3, it was generally the case that, of the conditions of using a multi-quantum well (MQW) active layer 304 which consists of four or fewer well layers, making a thickness of a flat part of a p-AlGaInP cladding layer 305 to be no greater than 300 nm, making a carrier concentration of a flat part of the p-AlGaInP cladding layer 305 to be higher than $5 \times 10^{17}$ cm$^{-3}$, at least one condition was satisfied.

The reason for this is that, because making the number of well layers of the quantum well active layer 304 small reduces the threshold current density, making a thickness of the flat part of the p-AlGaInP cladding layer 305 thin reduces lateral leakage current (reduces the threshold current and the operating current), and making the carrier density of the flat part of the p-AlGaInP cladding layer 305 high reduces the carrier overflow into the cladding layer from the active layer 304 (reduces the operating current at high temperature).

Note that in FIG. 3, the symbols 301, 302, 303 denote an n-GaAs substrate, an n-GaAs buffer layer and an n-AlGaInP cladding layer, respectively.

While, the symbols 306, 307, 308, 309 denote a p-AlGaInP etching stop layer, a p-AlGaInP cladding layer mesa part, a p-GaInP intermediate layer and a p-GaAs cap layer, respectively.

On the other hand, in FIG. 3, the symbols 310, 311, 312 and 313 denote an n-GaAs current blocking layer, a p-GaAs contact layer, p side electrode a and n side electrode, respectively.

With the structure of the past, for the reasons cited below, there was the problem that self-sustained pulsating operation did not occur at high temperature and high output.

Self-sustained pulsating operation in a self-sustained pulsating laser diode, is caused by a fact that a region in the MQW active layer where current is not injected and light is distributed functions as a saturable absorber.

Therefore, to enhance the self-sustained pulsating operation, it is important to widen the light distribution in the horizontal direction, and to suppress horizontal broadening of current.

To widen the light distribution in the horizontal direction, although it is effective to make an effective refractive index difference parallel to the layers between inside and outside the stripes ($\Delta$n) small, with the construction of the past, that is, one of a construction satisfying either or both of the conditions of four or fewer wells of the MQW active layer or a layer thickness in the flat part of the p-AlGaInIP cladding layer of less than 300 nm, it is not possible to achieve a sufficiently small value of $\Delta$n, thereby preventing enhanced self-sustained pulsating operation.

If the amount of current injection is large, such as in an operation at high temperatures or in an operation during high-output operation, there is a noticeable broadening of current in the flat part of the p-AlGaInP cladding layer in the horizontal direction.

For this reason, there is an increase in the current distribution compared with the light distribution in the horizontal direction, so that the effect of the saturable absorber is reduced, making it difficult to maintain self-sustained pulsating operation.

With the construction of the past, that is, with a construction having a carrier density of $5 \times 10^{17}$ cm$^{-3}$ in the flat part of the p-AlGaInP cladding layer, the resistance in the cladding layer is small, so that current easily broadens in the horizontal direction, thereby preventing the achievement of sufficient self-sustained pulsating operation at a high temperature or high output.

Accordingly, it is an object of the present invention to provide a semiconductor laser enabling stable self-sustained pulsating operation up to a high temperature.

SUMMARY OF THE INVENTION

To achieve the above-noted objects, the present invention adopts the following basic technical constitution.

Specifically, a first aspect of the present invention is a self-sustained pulsating laser diode which having a double-heterostructure minimally comprising, a cladding layer of a first conductivity type, a multi-quantum well active layer, and a cladding layer of a second conductivity type each being arranged on a semiconductor substrate of the first conductivity type, wherein the number of the multi-quantum well being at least 5 and no greater than 10, and the layer thickness of a flat part of the cladding layer having a current blocking structure is at least 300 nm and no greater than 500 nm, and further wherein a carrier density in the flat part of the cladding layer having a current blocking structure is at least $1 \times 10^{17}$ cm$^{-3}$ and no greater than $5 \times 10^{17}$ cm$^{-3}$.

A second aspect of the present invention is a self-sustained pulsating laser diode which having a double-heterostructure minimally comprising, a cladding layer of a first conductivity type, a multi-quantum well active layer, and a cladding layer of a second conductivity type each being arranged on a semiconductor substrate of the first conductivity type, wherein an effective refractive index difference parallel to the layer is at least $7 \times 10^{-4}$ and no greater than $3 \times 10^{-3}$, and further wherein a carrier density in a flat part of the cladding layer having a current blocking structure is at least $1 \times 10^{17}$ cm$^{-3}$ and no greater than $5 \times 10^{17}$ cm$^{-3}$.

A third aspect of the present invention is a variation on either the first or second aspect, wherein the cladding layer is made of a semiconductor that includes AlGaInP, and the active layer is a semiconductor that includes GaInP or AlGaInP.

A fourth aspect of the present invention is a variation on any one of the first to third aspects, wherein the (001) plane of the semiconductor substrate is misoriented by 5 degrees or more toward the [110] direction, and wherein the multi-quantum well active layer consists of compressively strained quantum well layers.

The construction of an AlGaInP self-sustained pulsating laser diode according to the present invention is shown in FIG. 1.

The semiconductor laser shown in FIG. 1 is fabricated using the three-step metal-organic vapor-phase epitaxy (MOVPE).

In the first crystal growth process, an n-GaAs buffer layer 102, an n-AlGaInP class layer 103, an MQW active layer 104, a p-AlGaInP cladding layer flat part 105, a p-AlGaInP etching stop layer 106, a p-AlGaInP cladding layer mesa part 107, a p-GaInP intermediate layer 108, and a p-GaAs cap layer 109 are sequentially formed on an n-GaAs substrate 101.

Next, a dielectric mask is used to form a mesa stripe shaped ridge structure, by means of etching. After this is done, selective growth is done using the dielectric mask (second crystal growth process), so as to form an n-GaAs current blocking layer 110 on the cladding layer in a part other than the mesa stripe.

Next, the dielectric mask is removed, and a third crystal growth process is performed, so as to grow a p-GaAs contact layer 111 over the entire surface.

After this is done, rear surface polishing and electrode forming processes are performed to complete the fabrication of the laser element.

A feature of a laser diode according to the present invention is that it satisfies all the conditions of (1) having five or more well layers but no greater than 10 well layers of the MQW active layer, (2) having a p-AlGaInP cladding layer flat part with a layer thickness of at least 300 nm and no greater than 500 nm, and (3) having a p-AlGaInP cladding layer flat part with a carrier density of at least $1 \times 10^{17}$ cm$^{-3}$ and no greater than $5 \times 10^{17}$ cm$^{-3}$.

By having five or more well layers of the MQW active layer and also having a p-AlGaInP cladding layer flat part with a layer thickness of at least 300 nm, the value of Δn is made sufficiently small, thereby enabling sufficient broadening of the light distribution in the horizontal direction.

Under these conditions, by making the carrier density in the p-AlGaInP cladding layer flat part no greater than $5 \times 10^{17}$ cm$^{-3}$, current broadening is suppressed, enabling the limitation of current distribution to well enough less than the light distribution, thereby enabling strong self-sustained pulsating operation, and enabling to keep stable self-sustained pulsating operation even at a high temperature.

On the other hand, by making the number of well layers of the MQW active layer greater than 10, or by making the layer thickness in the flat part of the p-AlGaInP cladding layer greater than 500 nm, or by making the carrier density in the p-AlGaInP cladding layer flat part less than $1 \times 10^{17}$ cm$^{-3}$, accompanying increases in the threshold carrier density: and lateral current broadening as well as increases in the carrier overflow into the cladding layer from the active layer, there is an increase in the threshold current and operating current, making high-temperature operation as a normal laser difficult, so that it is not possible to maintain self-sustained pulsating operation at a high temperature.

Thus, with the structure in the range indicated for the present invention, compared with the structure of the past, sufficiently strong self-sustained pulsating operation occurs, and it is possible to achieve stable self-sustained pulsating operation at high temperatures, which was not possible in the past (FIG. 2).

Therefore, a self-sustained pulsating laser diode according to the present invention achieves performance that is suitable for application to optical discs at a high temperature, and to application to DVDs for car navigation systems, and DVD-ROMs and the like for notebook personal computers.

DETAILED DESCRIPTION OF THE PREFERRED EMBODIMENTS

Embodiments of the present invention are described in detail below, with references made to relevant accompanying drawings.

Figure 1:
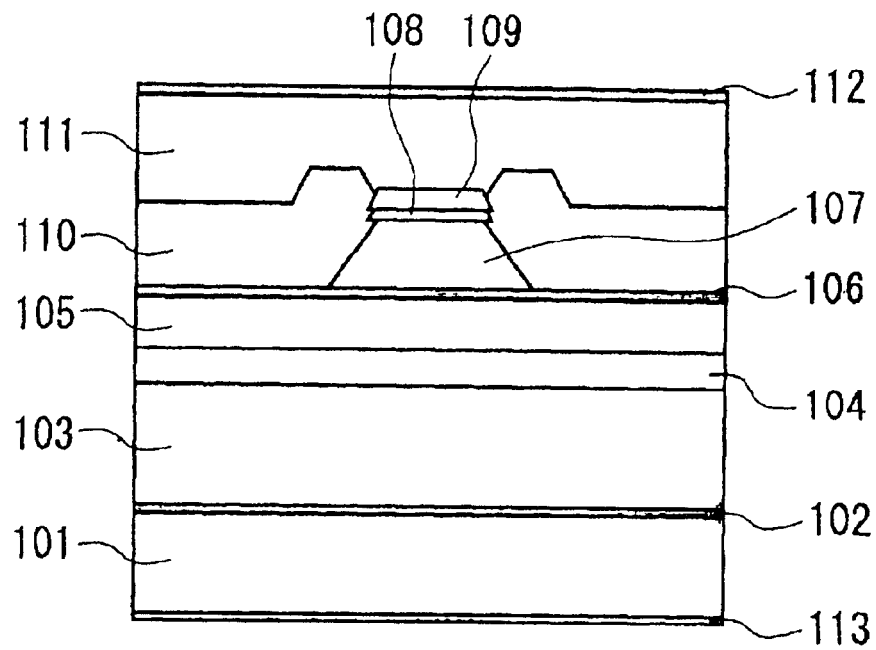
FIG. 1 is a drawing showing the construction of an embodiment of the present invention.

Specifically, FIG. 1 shows the construction of an AlGaInP self-sustained pulsating laser diode according to the present invention. The laser diode shown in FIG. 1 is fabricated using a three-step MOVPE process. With the first crystal growth process, a 0.3 μm-thick n-GaAs buffer layer 102, a 1 μm-thick n-AlGaInP cladding layer 103, an MQW active layer 104, a 0.4 μm-thick p-AlGaInP cladding layer flat part 105, a 10 nm-thick p-AlGaInP etching stop layer 106, a 0.6 μm-thick p-AlGaInP cladding layer mesa part 107, a 10 nm-thick p-GaInP intermediate layer 108, and a 0.3 μm-thick p-GaAs cap layer 109 are sequentially grown onto a (115) A n-GaAs substrate 101 misoriented by 15.8 degrees toward the [110] direction.

The MQW active layer 104 is formed by, for example, 5-nm-thick, 0.3% compressively strained GaInP well layers, and 5-nm-thick AlGaInP barrier layers, the number of well layers being at least 5 and no greater than 10, for example, 7. The structure above and below the MQW active layer 104 includes, for example, 50-nm-thick AlGaInP optical guiding layers.

The thickness of the p-AlGaInP cladding layer flat part 105 is at least 300 nm and no greater than 500 nm, for example 400 nm (0.4 μm). Additionally, the carrier density in the p-AlGaInP cladding layer flat part 105 is at least $1 \times 10^{17}$ cm$^{-3}$ and no greater than $5 \times 10^{17}$ cm$^{-3}$, for example $3 \times 10^{17}$ cm$^{-3}$.

Next, a dielectric mask is used to etch the p-GaAs cap layer 109, the p-GaInP intermediate layer 108, and the p-AlGaInP cladding layer mesa part 107, thereby forming a ridge structure with a 5 μm-wide mesa stripe shape.

After that is done, selective growth is done using the dielectric mask (second crystal growth process), thereby forming a 1 μm-thick n-GaAs current blocking layer 110 in a part of the cladding layer other than the mesa stripe. Next, the dielectric mask is removed, and a third crystal growth process is performed, so as to grow a 3 μm-thick p-GaAs contact layer 111 over the entire surface.

After that is done, rear surface polishing and electrode processes are performed to complete the fabrication of the laser element. In the construction of this embodiment, the value of Δn is approximately $1 \times 10^{-3}$ and, compared with the construction of the past (approximately $7 \times 10^{-3}$), it is possible to achieve a sufficient small value within a range that does not cause a worsening of laser characteristics.

A self-sustained pulsating laser diode fabricated as described above, satisfied all of the above-mentioned three conditions such as to have at least 5 and no more than 10 quantum well layers, to have a thickness of a flat part of a p-AlGaInP cladding layer to be at least 300 nm and not greater than 500 nm, and to have a carrier density of a p-AlGaInP cladding layer flat part to be at least $1\times10^{17}$ cm$^{-3}$ and of not greater than $5\times10^{17}$ cm$^{-3}$. By making the number of quantum well layers 5 or greater and also making the p-AlGaInP cladding layer flat part thickness at least 300 nm so that the Δn is made small, it is possible to achieve sufficient broadening of the light distribution in the horizontal direction.

Under these conditions, if the p-AlGaInP cladding layer flat part carrier density is no greater than $5\times10^{17}$ cm$^{-3}$, it is possible to make the current distribution small in comparison with the light distribution in the horizontal direction, so that it is possible to achieve sufficiently strong self-sustained pulsating operation, thereby enabling stable self-sustained pulsating operation at a high temperature, which was difficult to achieve in the past. When the number of quantum well layers is made more than ten, the threshold carrier density increases sharply, when the p-AlGaInP cladding layer flat part layer thickness is made greater than 500 nm, there is a noticeable current broadening, and when the p-AlGaInP cladding layer flat part carrier density is made less than $1\times10^{17}$ cm$^{-3}$, there is an increase in carrier overflow from the active layer into the cladding layer, so that high-temperature operation as a normal laser becomes difficult, and maintaining self-sustained pulsating operation becomes difficult at a high temperature.

Figure 2:
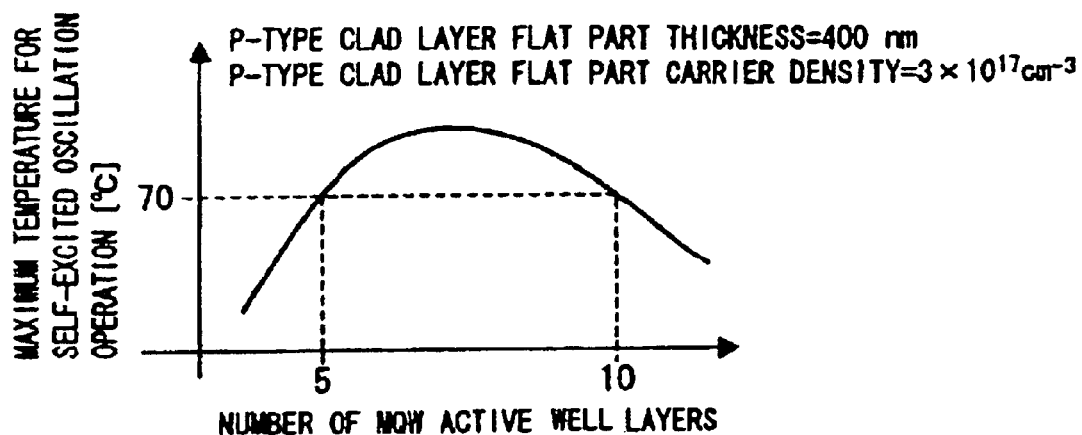
FIG. 2 is a drawing illustrating the effect and operation of an embodiment of the present invention.
Figure 2:
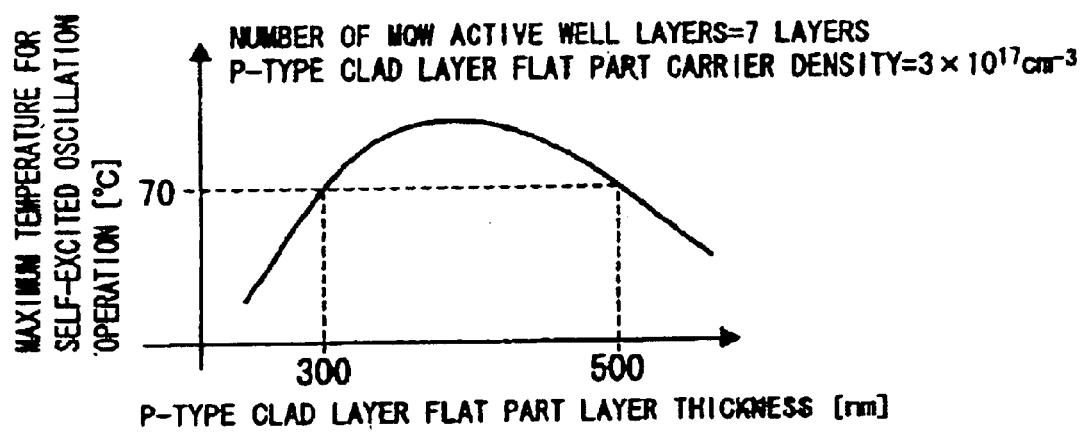
Figure 2:
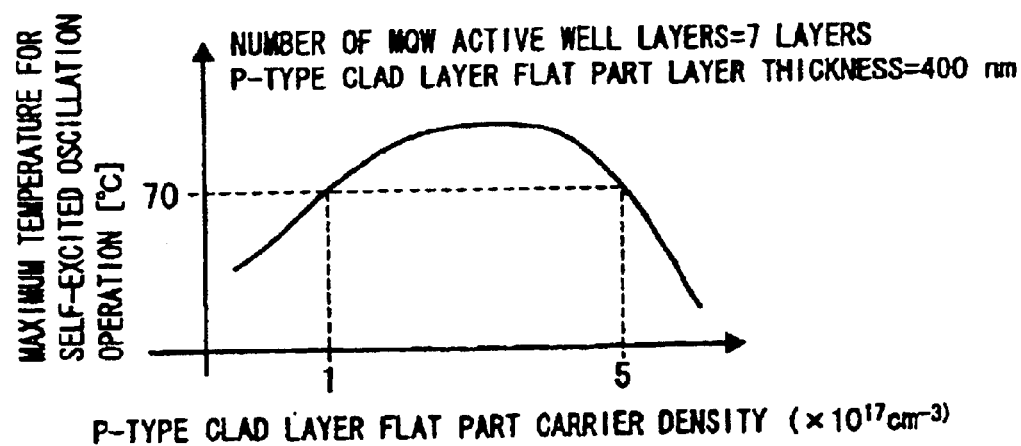
Figure 3:
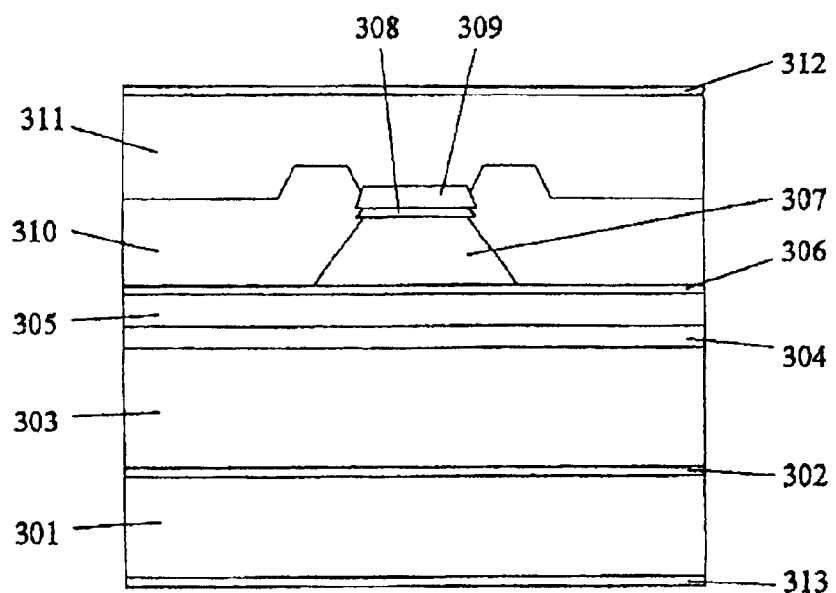
FIG. 3 is a drawing showing the construction of the prior art.

Thus, only with a construction within the limits indicated as the present invention does it become possible to achieve practical laser characteristics while enabling self-sustained pulsating operation at a high temperature, which was not possible in the past (FIG. 2).

Results of an evaluation of an actually fabricated device indicate that strong self-sustained pulsating operation is observed at a high temperature, even the maximum operating temperature is 120° C., and it is possible with the at 95° C. and 4 mW. The operating current is 100 mA at 70° C. and 5 mW, and present invention to achieve stable self-sustained pulsating operation up to a high temperature.

Note that, in accordance with the inventor's experiments as shown in FIGS. 2(A) to 2(C), the maximum temperature under which the self-sustained pulsating operation in a laser diode can be expected, which is one of the important characteristic technical feature of the present invention, can reach at 95° C. when the number of quantum well layers in the active layer is 7, when the thickness of the layer of a flat part of the p-type cladding layer is 400 nm or the carrier density of a flat part of the p-type cladding layer is $3\times10^{17}$ cm$^{-3}$, respectively, by fixing the designed parameter value as set forth in each one of FIGS. 2(A) to 2(C), respectively, constant.

And when the experiments had been done with the designed parameter value separated from those as shown in each one of FIGS. 2(A) to 2(C), all of data thus obtained could not show any superior data to those as shown in each one of FIGS. 2(A) to 2(C) and the inventors of this application feels that such designed parameter value as set forth in each one of FIGS. 2(A) to 2(C), are seemed to be the optimal parameter for this invention.

Regarding the refractive index difference parallel to the layers, inside and outside the stripe (Δn) as used in the present invention, the inventors of the present invention, had acknowledged through a lots of experiments, that when a value of the refractive index difference parallel to the layers, inside and outside the stripe (Δn) is larger than $3\times10^{-3}$, an optical confinement in a lateral direction becomes too strong so that any self-sustained pulsating operation cannot be generated or if generated, self-sustained pulsating operation is very weak so that it cannot practically used. On the other hand, when a value of the refractive index difference parallel to the layers, inside and outside the stripe (Δn) is less than $7\times10^{-4}$, a lateral mode control cannot be effective so that it cannot be used as LD.

Although the foregoing description of an embodiment of the present invention discusses an example in which the MQW active layer is formed by compressively strained well layers, it will be understood that it is alternatively possible to have this be tensile strained well layers, or unstrained well layers, or to have this be a strain-compensated MQW active layer.

Additionally, while the above-described embodiment used a substrate with a misorientation of 15.8 degrees, it will be understood that the same type of effect can be achieved regardless of the misorientation angle.

Regarding the misoriented substrate, the inventors of the present invention acknowledged that in developing AlGaInP visible laser diodes, quality of crystal as well as characteristics for LDs can be improved utilizing the (115) A substrate with reference to the information as shown in "Highly reliable operation at 80° C. for 650 nm 5 mW AlGaInP LDs" (Ohya, M., Fujii, H., Okuda, J., Anjiki, K., and Endo, K., Electron Letter, 1997, 33, pp. 1636–1638.)

And finally the inventors had acknowledged that the (115) A ((001) 15.8 degrees misoriented toward [110]) GaAs substrate 101, is one of a preferable condition through a lots of experiment thereabout.

According to the present invention, it is possible to achieve stable self-sustained pulsating operation even at a high temperature, which was difficult with the prior art. The reason for this is that the light distribution is sufficiently widening and the current distribution is made sufficiently small in the horizontal direction, without worsening the laser characteristics.

Compared with the prior art, the present invention is achieved by merely appropriately establishing the number of layers, layer thickness, and carrier density, so that it is possible to easily fabricate a high-performance self-sustained pulsating laser diode without a manufacturing process that is more complex than in the past.

What is claimed is:

1. A self-sustained pulsating laser diode having a double-heterostructure comprising:
    a first cladding layer of a first conductivity type;
    a multi-quantum well active layer; and
    a second cladding layer of a second conductivity type, both the first cladding layer and the second cladding layer being arranged on a semiconductor substrate of the first conductivity type, the number of said quantum wells being at least 5 and no greater than 10; and a layer thickness of a flat part of said second cladding layer having a current blocking structure being at least 300 nm and no greater than 500 nm; and a carrier density in said flat part of said second cladding layer having a current blocking structure being at least $1\times10^{17}$ cm$^{-3}$ and no greater than $5\times10^{17}$ cm$^{-3}$.

2. A self-sustained pulsating laser diode having a double-heterostructure comprising:

a first cladding layer of a first conductivity type;

a multi-quantum well active layer of at least five well layers; and a second cladding layer of a second conductivity type, both the first cladding layer and the second cladding layer being arranged on a semiconductor substrate of the first conductivity type, a layer thickness of a flat part of said second cladding layer having a current blocking structure being at least 300 nm, an effective refractive index difference parallel to the layers ($\Delta n$), said index resulting from said at least five well layers and said layer thickness of at least 300 nm, being at least $7 \times 10^{-4}$ and no greater than $3 \times 10^{-3}$, and a carrier density in a flat part of said second cladding layer having a current blocking structure being at least $1 \times 10^{17}$ cm$^{-3}$ and no greater than $5 \times 10^{17}$ cm$^{-3}$.

3. A self-sustained pulsating laser diode according to claim 1, wherein said cladding layers are made of a semiconductor that includes AlGaInP, and said active layer is a semiconductor that includes at least one of GaInP and AlGaInP.

4. A self-sustained pulsating laser diode according to claim 2, wherein said cladding layers are made of a semiconductor that includes AlGaInP, and said active layer is a semiconductor that includes at least one of GaInP and AlGaInP.

5. A self-sustained pulsating laser diode according to claim 1, wherein the (001) plane of said semiconductor substrate is misoriented by 5 degrees or more toward the [110] direction, and wherein said multi-quantum well active layer consists of compressively strained quantum wells.

6. A self-sustained pulsating laser diode according to claim 2, wherein the (001) plane of said semiconductor substrate is misoriented by 5 degrees or more toward the [110] direction, and wherein said multi-quantum well active layer consists of compressively strained quantum wells.

7. A self-sustained pulsating laser diode according to claim 3, wherein the (001) plane of said semiconductor substrate is misoriented by 5 degrees or more toward the [110] direction, and wherein said multi-quantum well active layer consists of compressively strained quantum wells.

8. A self-sustained pulsating laser diode according to claim 4, wherein the (001) plane of said semiconductor substrate is misoriented by 5 degrees or more toward the [110] direction, and wherein said multi-quantum well active layer consists of compressively strained quantum wells.

9. A self-sustained pulsating laser diode according to claim 1, wherein said carrier density in said flat part of said second cladding layer having a current blocking structure is less than $3 \times 10^{17}$ cm$^{-3}$.

10. A self-sustained pulsating laser diode according to claim 2, wherein said carrier density in said flat part of said second cladding layer having a current blocking structure is less than $3 \times 10^{17}$ cm$^{-3}$.

* * * * *